(12) United States Patent
Kurita et al.

(10) Patent No.: US 7,372,250 B2
(45) Date of Patent: May 13, 2008

(54) METHODS AND APPARATUS FOR DETERMINING A POSITION OF A SUBSTRATE RELATIVE TO A SUPPORT STAGE

(75) Inventors: Shinichi Kurita, San Jose, CA (US); Emanuel Beer, San Jose, CA (US); Edgar Kehrberg, Haar (DE); Matthias Brunner, Kirchheim (DE)

(73) Assignee: Applied Materials, Inc., Santa Clara, CA (US)

( * ) Notice: Subject to any disclaimer, the term of this patent is extended or adjusted under 35 U.S.C. 154(b) by 138 days.

(21) Appl. No.: 10/782,503

(22) Filed: Feb. 19, 2004

(65) Prior Publication Data

US 2004/0218193 A1     Nov. 4, 2004

Related U.S. Application Data

(60) Provisional application No. 60/448,821, filed on Feb. 20, 2003, provisional application No. 60/448,972, filed on Feb. 20, 2003, provisional application No. 60/448,855, filed on Feb. 20, 2003.

(51) Int. Cl.
*G01R 31/02* (2006.01)
*G01R 31/28* (2006.01)

(52) U.S. Cl. ............. 324/158.1; 324/754; 324/758

(58) Field of Classification Search ....... 324/158.1, 324/754–765
See application file for complete search history.

(56) References Cited

U.S. PATENT DOCUMENTS

| | | | |
|---|---|---|---|
| 4,628,238 A | 12/1986 | Smulders et al. | |
| 6,034,524 A * | 3/2000 | Barringer et al. | 324/158.1 |
| 6,075,375 A * | 6/2000 | Burkhart et al. | 324/758 |
| 6,158,946 A | 12/2000 | Miyashita | |
| 6,327,034 B1 | 12/2001 | Hoover et al. | |
| 6,499,367 B1 | 12/2002 | Saeki | |
| 6,624,897 B1 * | 9/2003 | Little | 356/614 |
| 7,151,981 B2 * | 12/2006 | Kurita et al. | 700/218 |
| 2002/0051697 A1 | 5/2002 | Ko et al. | |
| 2002/0109823 A1 * | 8/2002 | Binnard et al. | 355/53 |
| 2006/0145711 A1 * | 7/2006 | Honma | 324/754 |

FOREIGN PATENT DOCUMENTS

| | | |
|---|---|---|
| EP | 1 067 589 A2 | 1/2001 |
| JP | 04149917 | 5/1992 |
| JP | 06089845 | 3/1994 |
| JP | 06204321 | 7/1994 |

(Continued)

*Primary Examiner*—Ha Tran Nguyen
*Assistant Examiner*—Emily Y Chan
(74) *Attorney, Agent, or Firm*—Dugan & Dugan, P.C.

(57) ABSTRACT

A sensing system includes a plurality of probes arranged in a spaced relation around a stage that is adapted to support a substrate. Each probe includes a detection portion adapted to move from a known starting position toward an edge of the substrate that is supported by the stage; detect the edge of the substrate while the substrate is supported by the stage; generate a detection signal following said detection; and stop moving toward the edge of the substrate following said detection. A controller may determine an edge position of the substrate relative to the stage based on the known starting position of each detection portion and based on the detection signal generated by each detection portion. Numerous other aspects are provided.

24 Claims, 5 Drawing Sheets

FOREIGN PATENT DOCUMENTS

| | | | |
|---|---|---|---|
| JP | 08313815 | | 11/1996 |
| JP | 09090308 | * | 4/1997 |
| JP | 09152569 | | 6/1997 |
| JP | 09152569 | * | 10/1997 ................ 17/24 |
| JP | 2001358202 | | 12/2001 |
| JP | 2002308420 | | 10/2002 |

* cited by examiner

METHODS AND APPARATUS FOR DETERMINING A POSITION OF A SUBSTRATE RELATIVE TO A SUPPORT STAGE

The present application claims priority from U.S. Provisional Patent Application Ser. No. 60/448,821, filed Feb. 20, 2003, which is hereby incorporated by reference herein in its entirety.

CROSS REFERENCE TO RELATED APPLICATIONS

The present application is related to the following now abandoned U.S. Provisional Patent Applications:
- U.S. Provisional Patent Application Ser. No. 60/448,972, filed on Feb. 20, 2003 and titled "METHODS AND APPARATUS FOR POSITIONING A SUBSTRATE RELATIVE TO A SUPPORT STAGE"; and
- U.S. Provisional Patent Application Ser. No. 60/448,855, filed on Feb. 20, 2003 and titled "METHODS AND APPARATUS FOR POSITIONING A SUBSTRATE RELATIVE TO A SUPPORT STAGE".

Each of these provisional patent applications is hereby incorporated by reference herein in its entirety.

FIELD OF THE INVENTION

The present invention relates generally to flat panel display and/or semiconductor device manufacturing, and more particularly to determining a position of a substrate relative to a support stage.

BACKGROUND OF THE INVENTION

During the manufacture of flat panel displays, a glass substrate may be placed on a test stage for testing purposes. Typical substrate testing may include verifying the operation of thin film transistors formed on the substrate, e-beam inspection, defect detection, etc.

To accurately identify device and/or substrate locations for testing, and/or to reduce device/location search times, a position of a substrate relative to a test stage should be determined. Accordingly, improved methods and apparatus for quickly and accurately determining a position of a substrate relative to a test or other support stage would be desirable.

SUMMARY OF THE INVENTION

In a first aspect of the invention, a sensing system is provided that is adapted to determine a position of an edge of a substrate relative to a stage that supports the substrate. The sensing system includes a plurality of probes arranged in a spaced relation around a stage that is adapted to support a substrate. Each probe includes a detection portion that is adapted to (1) move from a known starting position toward an edge of the substrate that is supported by the stage; (2) detect the edge of the substrate while the substrate is supported by the stage; (3) generate a detection signal following said detection; and (4) stop moving toward the edge of the substrate following said detection. The sensing system also includes a controller coupled to the plurality of probes. The controller is adapted to determine a position of the edge of the substrate relative to the stage based on the known starting position of each detection portion and based on the detection signal generated by each detection portion.

In a second aspect of the invention, a probe is provided that includes a detection portion adapted to (1) move from a known starting position toward an edge of a substrate that is supported by a stage; (2) detect the edge of the substrate while the substrate is supported by the stage; (3) generate a detection signal following said detection; and (4) stop moving toward the edge of the substrate following said detection. The probe also includes a drive mechanism adapted to move the detection portion toward the stage and a controller coupled to the detection portion and the drive mechanism. The controller is adapted to determine a position of the edge of the substrate relative to the stage based on the known starting position of the detection portion and based on the detection signal generated by the detection portion.

In a third aspect of the invention, a method of determining a position of an edge of a substrate relative to a stage that supports the substrate is provided. The method includes the steps of (1) providing a plurality of detectors in a spaced relation around a stage that is adapted to support a substrate; (2) directing each detector to move from a known starting position toward the edge of the substrate; (3) detecting the edge of the substrate with each detector; (4) generating a detection signal from each detector following detection of the edge of the substrate by the detector; (5) directing each detector to stop moving toward the edge of the substrate following detection of the edge of the substrate by the detector; and (6) determining a position of the edge of the substrate relative to the stage based on the known starting position of each detector and based on the detection signal generated by each detector. Numerous other aspects are provided, as are methods and apparatus in accordance with these and other aspects of the invention.

Other features and aspects of the present invention will become more fully apparent from the following detailed description of exemplary embodiments, the appended claims and the accompanying drawings.

DETAILED DESCRIPTION

In accordance with the present invention, which is described below with reference to FIGS. 1A-B, and 2-4, methods and apparatus are provided for quickly and accurately determining a position of a substrate relative to a support stage without moving the substrate relative to the support stage. Because the substrate remains stationary relative to the support stage, the substrate is not damaged and/or particles or other contaminants are not generated during substrate position sensing. "Straightness" of the substrate relative to the stage also may be determined.

Figure 1A:
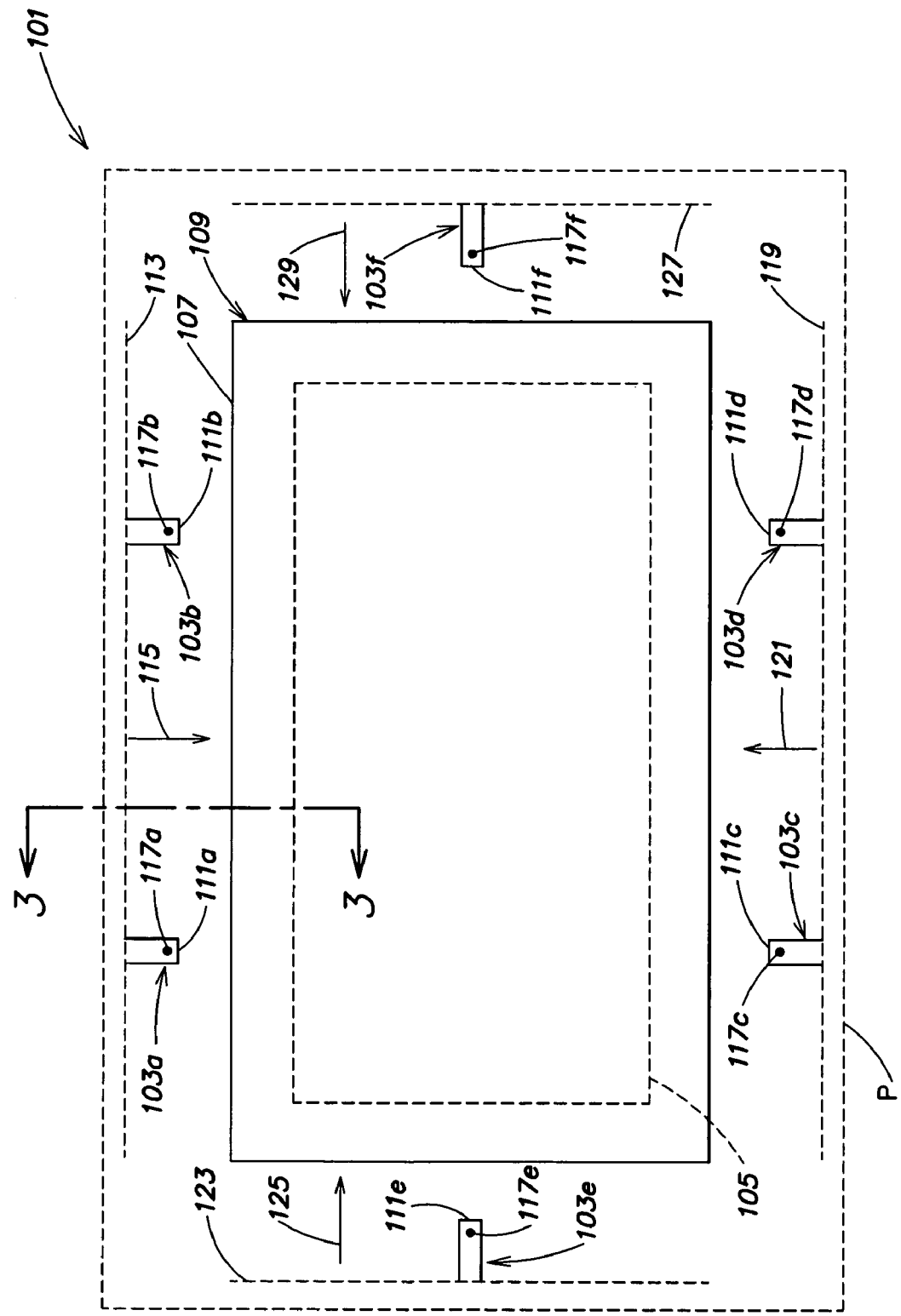
FIG. 1A is a schematic top view of a sensing system in accordance with the present invention.

FIG. 1A is a schematic top view of a sensing system 101 provided in accordance with the present invention. The sensing system 101 comprises a first through a sixth probe 103a-f preferably mounted in a common plane P around a test or other support stage 105 and adjacent to a peripheral edge 107 of a substrate 109 positioned on the test stage 105. The sensing system 101 alternatively may comprise probes mounted in different planes (not shown). As described below, the first probe 103a through sixth probe 103f are adapted to move toward the edge 107 of the substrate 109 during position sensing. In at least one embodiment of the invention, each probe 103a-f moves toward the edge 107 of the substrate 109 along a straight-line path (although a non-linear path may be employed). The substrate 109 may be, for example, a glass panel for a flat panel or liquid crystal display, a semiconductor wafer, a magnetic disk or the like.

With reference to FIG. 1A, the first through the sixth probes 103a-f comprise respective first through sixth detection portions 111a-f (e.g., detectors) for detecting the edge 107 of the substrate 109. Depending on the size and shape of the substrate 109, more or fewer probes may be employed. Exemplary embodiments of the probes 103a-f are described below with reference to FIG. 3.

The first probe 103a and the second probe 103b are positioned along a first alignment line 113, and are oriented so that the first detection portion 111a and the second detection portion 111b may move in a first direction 115, from first and second positions 117a, 117b toward the test stage 105. The first and second positions 117a, 117b represent known starting or "home" positions of the detection portions 111a, 111b relative to the test stage 105.

The third probe 103c and the fourth probe 103d are positioned at an opposite side of the test stage 105 from the first probe 103a and second probe 103b along a second alignment line 119 (e.g., parallel to the first alignment line 113). The third probe 103c and the fourth probe 103d are oriented so that the third detection portion 111c and the fourth detection portion 111d move in a second direction 121 opposite the first direction 115, from third and fourth positions 117c, 117d toward the test stage 105. The third and fourth positions 117c, 117d represent known starting or home positions of the detection portions 111c, 111d relative to the test stage 105.

The fifth probe 103e is positioned along a third alignment line 123. The fifth probe 103e is oriented so that the fifth detection portion 111e may move along a third direction 125 from a fifth position 117e toward the test stage 105. The fifth position 117e represents a known starting or home position of the detection portion 111e relative to the test stage 105.

The sixth probe 103f is positioned at an opposite side of the test stage 105 from the fifth probe 103e along a fourth alignment line 127. The sixth probe 103f is oriented so that the sixth detection portion 111f may move along a fourth direction 129 opposite the third direction 125, from a sixth position 117f toward the test stage 105. The sixth position 117f represents a known starting or home position of the detection portion 111f relative to the test stage 105.

The detection portions 111a-f of the probes 103a-f are shown in FIG. 1A in retracted positions. Setting the detection portions 111a-f in retracted positions allows substrates to be loaded onto and removed from the test stage 105. In the present example, the substrate 109 rests on the test stage 105, and the edge 107 of the substrate 109, which overhangs the test stage 105 as shown, can be detected by the probes 103a-f of the sensing system 101 (as described below) so that a position of the edge 107 of the substrate 109 relative to the test stage 105 can be determined by the sensing system 101. In general, the substrate 109 need not overhang the test stage 105 (e.g., the test stage 105 may be larger than the substrate 109).

In operation, the detection portions 111a-f of the probes 103a-f of the sensing system 101 begin to move from the known starting positions 117a-f toward the test stage 105 so as to eventually detect the substrate 109. After moving through respective distances, all of which may by different from each other, the detection portions 111a-f detect the edge 107 of the substrate 109. Detection may include physical contact with the substrate 109, or detection of some other detectable event (e.g., a change in light reflection or transmission properties due to the presence of the substrate 109 if a reflective or through-beam sensor system is employed). Upon detecting the edge 107 of the substrate 109, each detection portion 111a-f generates an edge-detection signal, and stops moving toward the test stage 105. As described further below, the edge detection signals enable the sensing system 101 to determine the distances through which the detection portions 111a-f moved from the known starting positions 117a-f to the edge 107 of the substrate 109. The sensing system 101 then may determine a position of the edge 107 of the substrate 109 relative to the test stage 105 based on the known starting positions 117a-f (which one known relative to the test stage 105) and the distances through which the detection portions 111a-f moved in order to detect the edge 107 of the substrate 109. Such substrate position determinations may be performed quickly and accurately without moving the substrate 109 relative to the test stage 105.

Figure 1B:
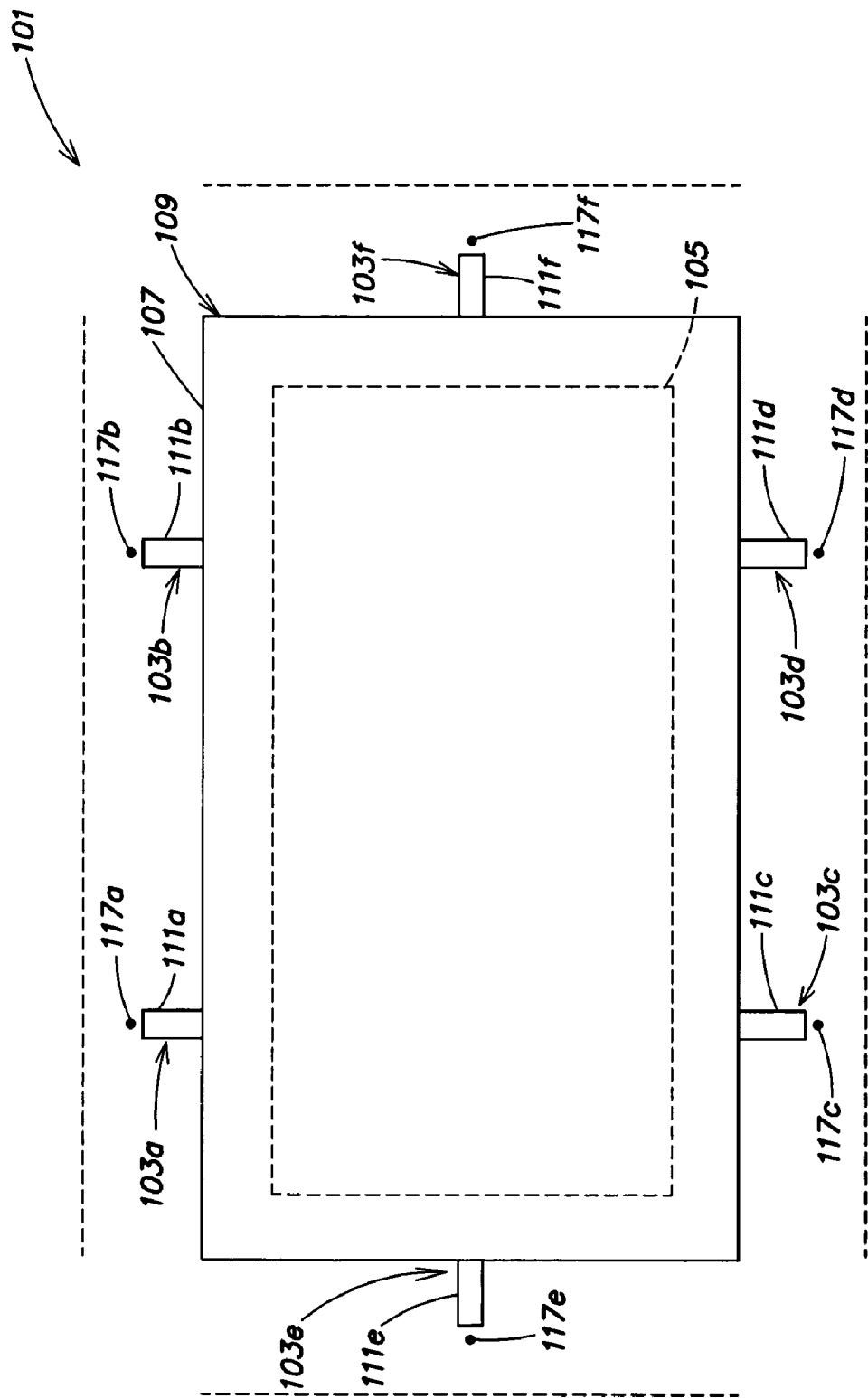
FIG. 1B is a schematic top view of the sensing system of FIG. 1A in a configuration in which detection portions of probes detect the edge of a substrate.

FIG. 1B is a schematic top view of the sensing system 101 of FIG. 1A in a configuration in which the detection portions 111a-f of the probes 103a-f detect the edge 107 of the substrate 109. By comparison to the retracted positions of the detection portions 111a-f shown in FIG. 1A, in FIG. 1B the detection portions 111a-f have moved from the known starting positions 117a-f (which are known relative to the test stage 105) and have detected the edge 107 of the substrate 109. Upon such detection, the detection portions 111a-f may generate detection signals, and stop moving toward the test stage 105, as described above.

In at least one embodiment of the invention, one or more of the detection portions 111a-f may comprise a switch (FIG. 3) adapted to actuate upon contacting the edge 107 of the substrate 109 and to generate a detection signal upon actuation (e.g., via the opening or closing of the switch). Alternatively, one or more of the detection portions 111a-f may comprise a through-beam or reflective sensor adapted to detect the presence or absence of a light beam upon detection of the edge 107 of the substrate 109 and to generate a detection signal thereupon (e.g., a change in detector current). Other types of detection mechanisms may be used for this purpose, either solely or in combination. Preferably, however, to protect the substrate 109 against harmful impact or abrasion, sensing system 101 is adapted to detect the edge 107 of the substrate 109 without causing the substrate 109 to move (e.g., slide) relative to the test stage 105 upon which the substrate 109 rests. For example, if each detection portion 111a-f comprises a switch, each switch preferably is actuated by contacting the edge 107 of the substrate 109 without sliding the substrate 109 relative to the test stage 105.

Figure 2:
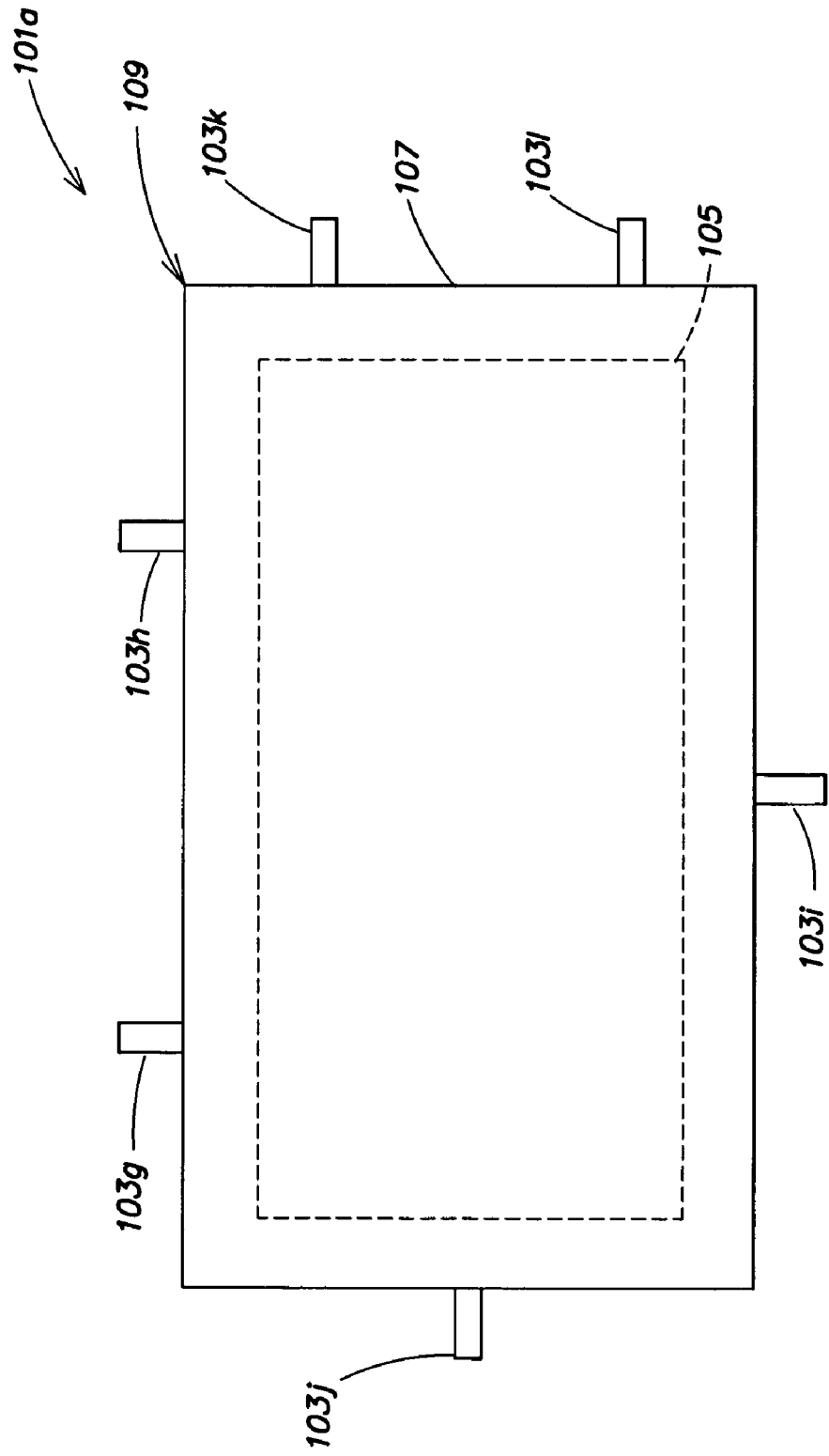
FIG. 2 is a schematic top view of a first alternative embodiment of the sensing system of FIGS. 1A-1B.

FIG. 2 is a schematic top view of a first alternative embodiment 101a of the sensing system 101 of FIGS. 1A-1B. The alternative sensing system 101a also comprises six probes, i.e., a seventh through a twelfth probe 103g-l. The difference between the first alternative sensing system 101a of FIG. 2 and the sensing system 101 of FIGS. 1A-1B is the manner in which the probes are arranged. For example, in FIG. 2, two probes 103k, 103l are employed near the right side of the test stage 105 (the "short" side of the test stage 105) while only one probe 103i is employed near the bottom side of the test stage 105 (the "long" side of the test stage 105). In contrast, in FIGS. 1A and 1B, only one probe 103f is employed near the right side of the test stage 105 and two probes 103c, 103d are employed near the bottom side of the test stage 105. Other configurations and/or numbers of probes may be employed.

Figure 3:
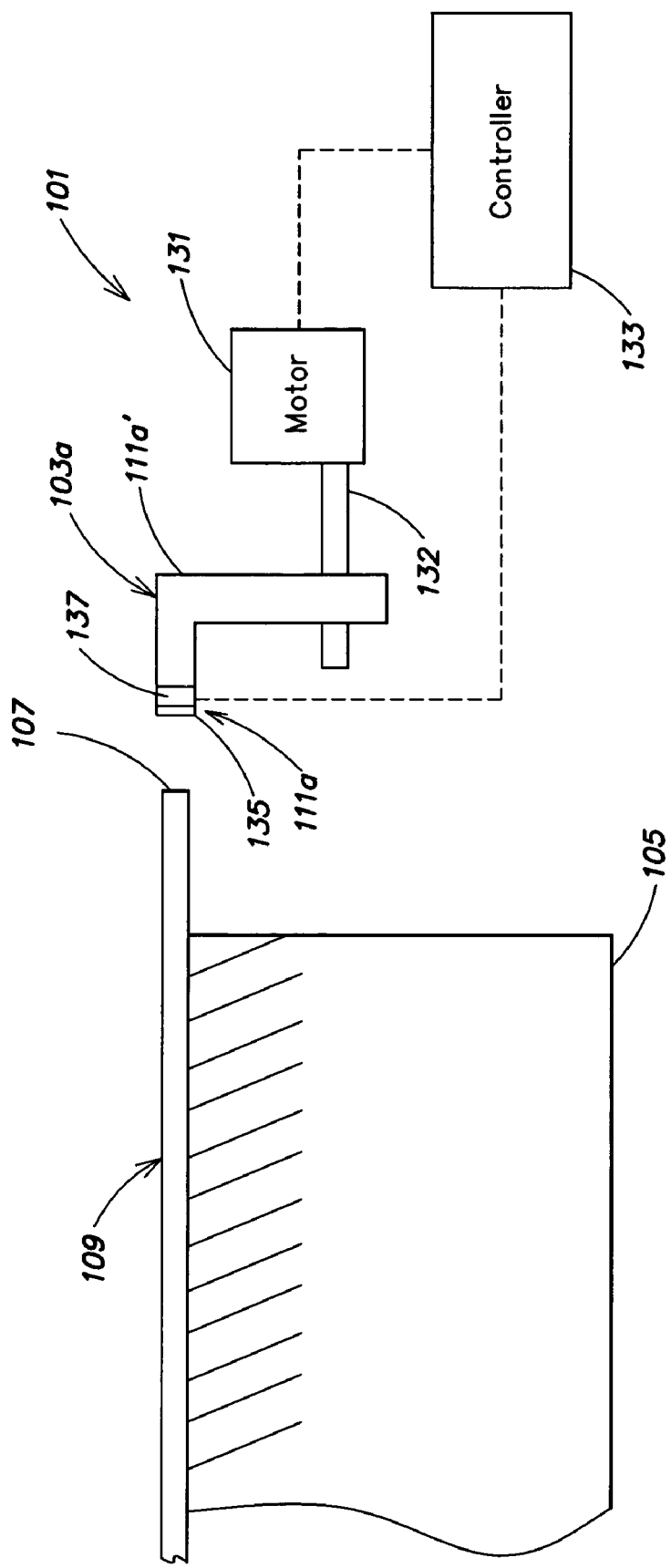
FIG. 3 is a schematic side view of an exemplary section of the sensing system of FIG. 1A taken at section 3-3 of FIG. 1A.

FIG. 3 is a schematic side view of an exemplary section of the sensing system 101 taken at section 3-3 of FIG. 1A. In the embodiment of FIG. 3, the first probe 103a includes a generally L-shaped main body 111a' coupled to the detection portion 111a, a motor 131 coupled to the main body 111a' via an extendible member 132 and a controller 133 coupled to the detection portion 111a and the motor 131. Other main body shapes may be employed. As stated previously, the detection portion 111a may comprise a switch (e.g., a conventional pressure actuated switch (FIG. 3) that provides a signal to the controller 133 when the detection portion 111a contacts the edge 107 of the substrate 109), a light beam sensor (not shown) or the like. Each of the other probes 103b-f (FIGS. 1A-1B) may be similarly configured. (The probes 103g-l also may be similarly configured).

The motor 131 may comprise, for example, a conventional linear motor such as a stepper or servo motor that moves the probe 103a toward or away from the test stage 105 based on the direction of rotation of the motor 131. A pneumatic cylinder, a piezoelectric device or other drive mechanism similarly may be employed to move the probe 103a toward and away from the test stage 105. Each probe 103b-f may comprise a similar motor or driving mechanism that may be controlled via the controller 133.

The controller 133 may comprise, for example, one or more appropriately programmed microprocessors or microcontrollers, a dedicated hardware circuit, or a combination thereof, etc., adapted to:

(1) control movement of the probe 103a toward and away from the test stage 105 (e.g., via the motor 131 or a similar drive mechanism);

(2) detect when the probe 103a contacts the edge 107 of the substrate 109 (e.g., via a detection signal generated by the detection portion 111a and provided to the controller 133);

(3) stop movement of the probe 103a toward the test stage 105 in response to the detection signal generated by the detection portion 111a of the probe 103a;

(4) perform operations similar to (1)-(3) for the other probes 103b-f; and/or (5) determine the position of the substrate 109 relative to the test stage 105 based on the detection signals generated by the detection portions 111a-f of the probes 103a-f (and the known "starting" positions 117a-f of the probes 103a-f).

Figure 4:
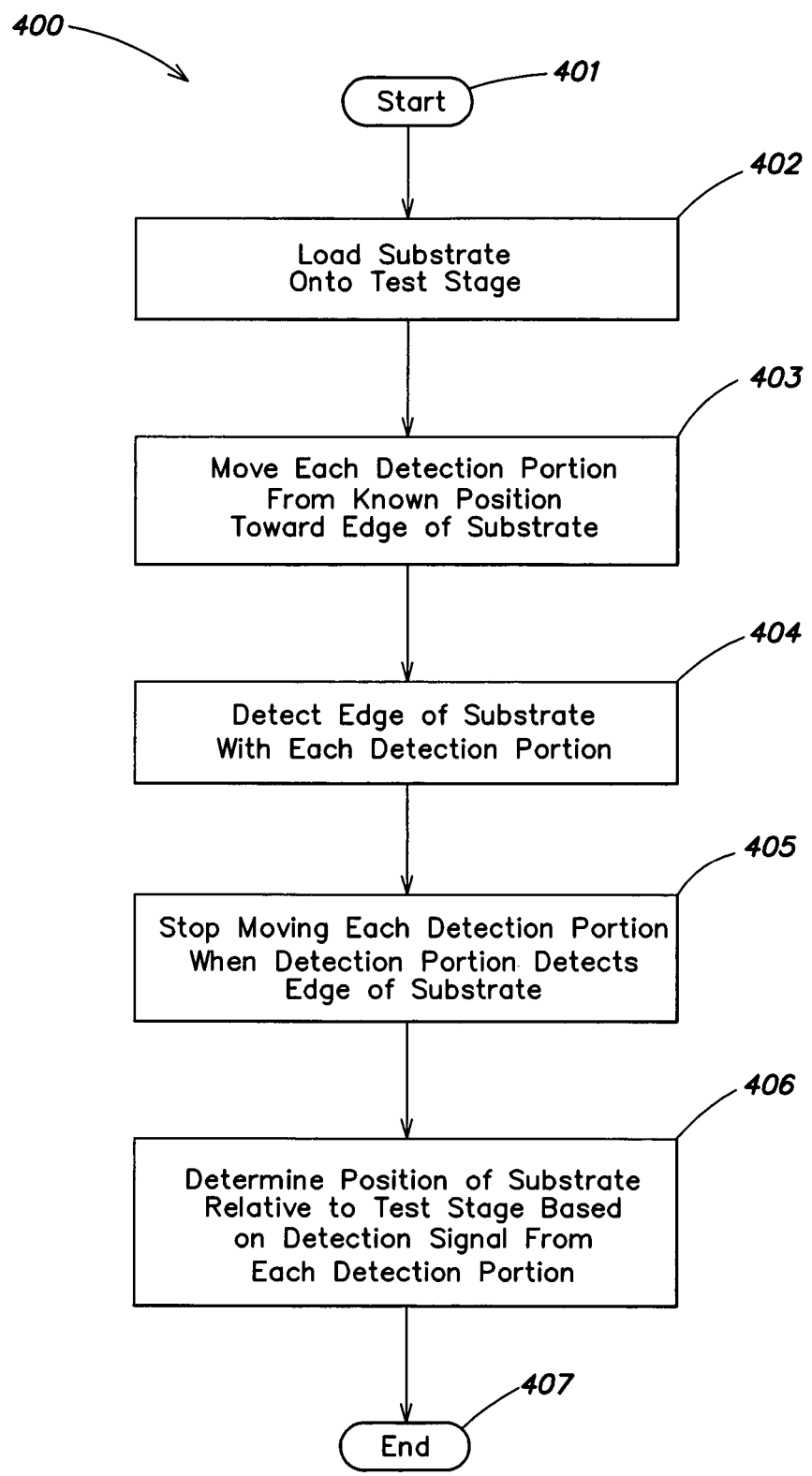
FIG. 4 is a flowchart of an exemplary process provided in accordance with the present invention for detecting the position of the edge of a substrate relative to a test stage while the test stage supports the substrate.

FIG. 4 is a flowchart of an exemplary process 400 provided in accordance with the present invention for detecting the position of the edge 107 of the substrate 109 relative to the test stage 105 while the test stage 105 supports the substrate 109. One or more of the steps of the process 400 of FIG. 4 may be implemented as one or more computer program products. Each computer program product described herein may be carried by a medium readable by a computer (e.g., a carrier wave signal, a floppy disc, a compact disc, a DVD, a hard drive, a random access memory, etc.).

With reference to FIG. 4, the process 400 begins with step 401. In step 402, the substrate 109 is loaded onto the test stage 105. For example, the substrate 109 may be loaded onto the test stage 105 via a substrate handler, a technician or any conventional means. Preferably each probe 103a-f is fully retracted (e.g., the detection portions 111a-f are retracted to the known/home position 117a-f shown in FIG. 1A) to provide clearance for loading the substrate 109 onto the test stage 105. In at least one embodiment, the detection portions 111a-f are approximately 3-4 mm from the test stage 105 when fully retracted, although other distances may be employed.

In step 403, the controller 133 (FIG. 3) directs each detection portion 111a-f to move toward the edge 107 of the substrate 109. For example, in the embodiment of FIG. 3, the controller 133 may direct the motor 131 to rotate so as to move the extendable member 132 (and the probe 103a coupled thereto) toward the edge 107 of the substrate 109. The probes 103b-f may be similarly controlled via the controller 133. In at least one embodiment, the probes 103a-f travel toward the substrate 109 at a rate of about 1.5-4 mm/second, although other rates may be employed. Two or more of the probes 103a-f may move toward the substrate 109 simultaneously or sequentially in any order.

Following step 403, for each probe 103a-f, in steps 404 and 405 the controller 133 detects the edge 107 of the substrate 109 and stops the probe 103a-f/detection portion 111a-f from moving further. For example, with reference to FIG. 3, when the detection portion 111a of the probe 103a contacts the edge 107 of the substrate 109, the detection portion 111a generates a signal (e.g., a "detection signal") that is communicated to the controller 133 (step 404). In response to the detection signal, the controller 133 signals the motor 131 to stop movement of the probe 103a toward the substrate 109 (step 405). Similar steps may be performed for each of the probes 103b-f. In at least one embodiment of the invention, movement of each probe 103a-f is stopped prior to significant (e.g., less than about 10 microns, and more preferably less than about 1 micron) or any movement of the substrate 109 by the probes 103b-f. Note that following steps 404 and 405, each probe 103a-f is in contact with the edge 107 of the substrate 109 (FIGS. 1B or 2).

As stated, in at least one embodiment of the invention, one or more of the detection portions 111a-f may comprise a switch (FIG. 3) adapted to actuate upon contacting the edge 107 of the substrate 109 and to generate a detection signal upon actuation (e.g., via the opening or closing of the switch). Each switch may include an actuatable portion 135 that is actuated by the edge 107 of the substrate 109 as a main body 137 of the switch (of the respective probe 103a-f) moves toward the substrate 109. Assuming the switch actuates before the substrate 109 contacts the main body of the switch, the controller 133 may be signaled to stop movement of the respective probe 103a-f before the main body of the switch contacts and/or moves the substrate 109 relative to the test stage 105. Further, the main body of the switch of each probe 103a-f may serve as a "hard stop" so that the probes 103a-f collectively cradle the substrate 109 and limit lateral motion of the substrate 109 relative to the test stage 105. For example, in at least one embodiment of the invention, each probe 103a-f may be coupled to and/or otherwise translate with the stage 105 during testing, processing or the like; and the probes 103a-f (via the main body of the switch of each probe) may prevent/reduce lateral motion between the substrate 109 and the test stage 105 during such translations. In at least one embodiment of the invention, each probe 103a-f stops movement toward the substrate 109 when the main body of the switch of the probe 103a-f is within about 100 microns, more preferably within about 10 microns, and more preferably still within about 1 micron, of the edge 107 of the substrate 109.

In step 406, the controller 133 determines the position of the substrate 109 relative to the test stage 105. For example, the controller 133 may determine how far each detection portion 111a-f (and/or each probe 103a-f) traveled to reach the substrate 109 (e.g., by monitoring the number of rotations or steps that each motor 131 performed before the detection signal of the corresponding detection portion 111a-f was received). Because each detection portion 111a-f was in a known starting position 117a-f relative to the test stage 105 prior to moving toward the edge 107 of the substrate 109, the distance each detection portion 111a-f traveled to detect the edge 107 of the substrate 109 may be employed to determine the position of the edge 107 of the substrate 109 relative to each side of the test stage 105 (e.g., by subtracting the distance traveled by each detection portion 111a-f from the its respective known starting position 117a-f). Based on the determined substrate position information, device or other locations on the substrate 109 may be easily tested or inspected. In at least one embodiment, the sensor system 101 may determine the position of the edge 107 of the substrate 109 relative to the test stage 105 within about 100 microns, more preferably within about 10 microns and more preferably still within about 1 micron (depending on the accuracy of each motor 131, the amount of deflection experienced by the detection portions 111a-f prior to detection signal generation by the detection portions 111a-f, the response time of the controller 133 and/or the motors 131, etc.).

Substrate position information determined by the controller 133 may include, for example, straightness of the substrate 109 relative to the test stage 105. That is, if detection portions 111a, 111b of probes 103a, 103b (FIG. 1A) have traveled a similar distance from positions 117a, 117b before detecting the edge 107 of the substrate 109, then the substrate 109 is approximately straight relative to the test stage 105. The probes 103c and 103d may be similarly employed to determine substrate straightness relative to the test stage 105, as may be the probes 103g, 103h and 103k, 103l of FIG. 2.

Following step 406, the process 400 ends with step 407. Substrate testing and/or inspection then may be performed. For example, substrate position information obtained by the process 400 may be used as an "offset" for device test probe placement, e-beam inspections, etc. That is, the position of the substrate 109 relative to the stage 105 may be used to control a device and/or process that depends on substrate position (e.g., a localized process, patterning, exposure, testing, local deposition, laser cutting, etc.).

The foregoing description discloses only exemplary embodiments of the invention; modifications of the above disclosed apparatus and methods which fall within the scope of the invention will be readily apparent to those of ordinary skill in the art. For example, while the present invention has been described primarily with regard to determining the position of glass plates relative to a test stage or other support stage, it will be understood that the present invention may be employed to detect the position of other types of substrates relative to these or other types of stages.

Accordingly, while the present invention has been disclosed in connection with exemplary embodiments thereof, it should be understood that other embodiments may fall within the spirit and scope of the invention, as defined by the following claims.

The invention claimed is:

1. A sensing system adapted to determine a position of an edge of a substrate relative to a stage that supports the substrate, comprising:
   a plurality of probes arranged in a spaced relation around a stage that is adapted to support a substrate, wherein each probe includes a detection portion that is adapted to:
      move from a known starting position toward an edge of the substrate that is supported by the stage;
      detect the edge of the substrate while the substrate is supported by the stage by contacting the edge of the substrate;
      generate a detection signal following said detection; and
      stop moving toward the edge of the substrate following said detection; and
   a controller coupled to the plurality of probes and adapted to determine a position of the edge of the substrate relative to the stage based on the known starting position of each detection portion and based on the detection signal generated by each detection portion.

2. The sensing system of claim 1, wherein each detection portion comprises a switch adapted to contact the edge of the substrate and generate a detection signal upon said contact.

3. The sensing system of claim 1, wherein each of the detection portions is adapted to move toward the edge of the substrate along a straightline path.

4. The sensing system of claim 3, wherein the plurality of probes resides in a common plane containing the straightline paths of the detection portions.

5. The sensing system of claim 4, wherein the plurality of probes includes a first and a second probe positioned along a first line within the common plane when the first and second probes are retracted.

6. The sensing system of claim 5, wherein the plurality of probes includes a third and a fourth probe positioned at an opposite side of the stage from the first and second probes along a second line within the common plate when the third and fourth probes are retracted.

7. The sensing system of claim 6, wherein the plurality of probes includes a fifth probe positioned along a third line within the common plane and approximately perpendicular to the first and second lines when the fifth probe is retracted.

8. The sensing system of claim 7, wherein the plurality of probes includes a sixth probe positioned at an opposite side of the stage from the fifth probe along a fourth line within the common plane and approximately perpendicular to the first and second lines when the sixthe probe is retracted.

9. The sensing system of claim 5, wherein the plurality of probes includes a third and a fourth probe positioned along a second line within the common plane and approximately perpendicular to the first line when the third and fourth probes are retracted.

10. The sensing system of claim 1, further comprising a plurality of drive mechanisms, each drive mechanism coupled to a respective one of the probes and adapted to move the respective one of the probes toward and away from the edge of the substrate.

11. The sensing system of claim 10 wherein each drive mechanism comprises a motor.

12. The sensing system of claim 11, wherein the controller is coupled to each of the plurality of motors, and for each of the plurality of probes the controller is adapted to:

direct the motor coupled to the probe to move the detection portion of the probe toward the edge of the substrate;

receive the detection signal generated by the detection portion of the probe when the detection portion detects the edge of the substrate; and in response to the received detection signal, direct the motor coupled to the probe to stop movement of the detection portion of the probe toward the edge of the substrate.

13. The sensing system of claim 12 wherein:

the detection portion of each probe is further adapted to retract from the stage so as to allow the substrate to be loaded onto and removed from the stage; and the controller is further adapted to direct each motor to retract the detection portion of the probe coupled to the motor to the known starting position of the detection portion.

14. The sensing system of claim 12 wherein the controller is further adapted to:

determine a distance the detection portion of each probe traveled from the known starting position of the detection portion to a position at which the detection portion detected the edge of the substrate; and determine the position of the edge of the substrate relative to the stage based on the distance traveled by the detection portion of each probe.

15. The sensing system of claim 14 wherein the controller is further adapted to determine straightness of the substrate relative to the stage based on a plurality of the determined distances.

16. A probe, comprising:

a detection portion adapted to:

move from a known starting position toward an edge of a substrate that is supported by a stage;

detect the edge of the substrate while the substrate is supported by the stage by contacting the edge of the substrate;

generate a detection signal following said detection; and stop moving toward the edge of the substrate following said detection;

a drive mechanism adapted to move the detection portion toward the stage; and a controller coupled to the detection portion and the drive mechanism, and adapted to determine a position of the edge of the substrate relative to the stage based on the known starting position of the detection portion and based on the detection signal generated by the detection portion.

17. The probe of claim 16 wherein the controller is further adapted to:

direct the drive mechanism to move the detection portion of the probe toward the edge of the substrate;

receive the detection signal generated by the detection portion of the probe when the detection portion detects the edge of the substrate; and in response to the received detection signal, direct the drive mechanism to stop movement of the detection portion of the probe toward the edge of the substrate.

18. The probe of claim 16 wherein the detection portion comprises a switch adapted to contact the edge of the substrate and generate a detection signal upon said contact.

19. The probe of claim 16 wherein:

the detection portion is further adapted to retract from the stage so as to allow the substrate to be loaded onto and removed from the stage; and the controller is further adapted to direct the drive mechanism to retract the detection portion to the known starting position of the detection portion.

20. A method of determining a position of an edge of a substrate relative to a stage that supports the substrate, comprising:

providing a plurality of detectors in a spaced relation around a stage that is adapted to support a substrate;

directing each detector to move from a known starting position toward the edge of the substrate;

detecting the edge of the substrate with each detector by contacting the edge of the substrate with each detector;

generating a detection signal from each detector following detection of the edge of the substrate by the detector;

directing each detector to stop moving toward the edge of the substrate following detection of the edge of the substrate by the detector; and determining a position of the edge of the substrate relative to the stage based on the known starting position of each detector and based on the detection signal generated by each detector.

21. The method of claim 20 wherein:

directing each detector to move from a known starting position toward the edge of the substrate comprises directing a motor to move the detector toward the edge of the substrate; and directing each detector to stop moving following detection of the edge of the substrate by the detector comprises:

receiving the detection signal generated by the detector when the detector detects the edge of the substrate; and in response to the received detection signal, directing the motor to stop movement of the detector.

22. The method of claim 20 further comprising retracting the plurality of detectors to the known starting positions of the detectors.

23. The method of claim 20 wherein determining a position of the edge of the substrate relative to the stage based on the known starting position of each detector and based on the detection signal generated by each detector comprises:

determining a distance each of the plurality of detectors traveled from the known starting position of the detector to a position at which the detector detected the edge of the substrate; and determining the position of the edge of the substrate relative to the stage based on the distances traveled by each detector.

24. The method of claim 23 further comprising determining straightness of the substrate relative to the stage based on a plurality of the distances.

* * * * *